(12) United States Patent
Tomimatsu et al.

(10) Patent No.: US 7,193,366 B2
(45) Date of Patent: Mar. 20, 2007

(54) DISPLAY APPARATUS AND METHOD OF MANUFACTURING THE SAME

(75) Inventors: Toshifumi Tomimatsu, Kumagaya (JP); Michiya Kobayashi, Ishikawa-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 327 days.

(21) Appl. No.: 10/683,360

(22) Filed: Oct. 14, 2003

(65) Prior Publication Data
US 2004/0150319 A1 Aug. 5, 2004

Related U.S. Application Data

(63) Continuation of application No. PCT/JP03/01017, filed on Jan. 31, 2003.

(30) Foreign Application Priority Data
Feb. 4, 2002 (JP) .................... 2002-027123

(51) Int. Cl.
*H05B 33/04* (2006.01)
*H01L 51/00* (2006.01)
(52) U.S. Cl. .................. 313/512; 313/292; 313/504
(58) Field of Classification Search .......... 313/512, 313/506, 504, 292, 238
See application file for complete search history.

(56) References Cited
U.S. PATENT DOCUMENTS 6,717,052 B2 * 4/2004 Wang et al. ............ 174/52.3
6,788,278 B2 * 9/2004 Aoki .......................... 345/82
6,833,668 B1 * 12/2004 Yamada et al. ............ 313/505
6,911,773 B2 * 6/2005 Seki .......................... 313/506
7,112,115 B1 * 9/2006 Yamazaki et al. ........... 445/25

FOREIGN PATENT DOCUMENTS

| JP | 11-54285 | 2/1999 |
|---|---|---|
| JP | 11-121165 | 4/1999 |
| JP | 2000-100561 | 4/2000 |
| JP | 2000-173766 | 6/2000 |
| JP | 2000-195675 | 7/2000 |
| JP | 2000208251 A * | 7/2000 |
| JP | 2001-76866 | 3/2001 |
| JP | 2001-126866 | 5/2001 |
| JP | 2001-237067 | 8/2001 |
| JP | 2001-345175 | 12/2001 |
| JP | 2003142257 A * | 5/2003 |

* cited by examiner

*Primary Examiner*—Karabi Guharay
(74) *Attorney, Agent, or Firm*—Oblon, Spivak, McClelland, Maier & Neustadt, P.C.

(57) ABSTRACT

A display apparatus includes an array substrate including a display area composed of a plurality of pixels arranged in a matrix, and a sealing substrate disposed to be opposed to the array substrate. The display area includes a pixel switch that selects a pixel, a drive control device connected to the pixel switch, and an organic EL device driven by the drive control device. A support section is disposed in a frame shape on an outer peripheral portion of the display area such that a predetermined gap is provided between the array substrate and the sealing substrate.

11 Claims, 5 Drawing Sheets

DISPLAY APPARATUS AND METHOD OF MANUFACTURING THE SAME

CROSS-REFERENCE TO RELATED APPLICATIONS

This is a Continuation Application of PCT Application No. PCT/JP03/01017, filed Jan. 31, 2003, which was not published under PCT Article 21(2) in English.

This application is based upon and claims the benefit of priority from the prior Japanese Patent Application No. 2002-027123, filed Feb. 4, 2002, the entire contents of which are incorporated herein by reference.

BACKGROUND OF THE INVENTION

1. Field of the Invention

The present invention relates to a display apparatus and a method of manufacturing the display apparatus, and more particularly to a self-emission type display apparatus such as an organic electro-luminescence (EL) display apparatus and a method of manufacturing the same.

2. Description of the Related Art

In recent years, organic EL display apparatuses have attracted attention as flat display apparatuses. The organic EL display apparatus has self-luminescence properties. Thus, it has features: a wide viewing angle is provided, reduction in thickness is achieved without a need for backlight, power consumption can be decreased, and a responsivity speed is high. The organic EL display apparatus is configured such that a plurality of organic EL devices are arranged on an array substrate in a matrix. Each organic EL device has such a structure that an organic light-emitting layer including an organic compound with a light-emitting function is sandwiched between an anode and a cathode.

The organic EL device is very susceptible to moisture. Even a small amount of moisture, e.g. about 1 ppm, would destroy the organic EL device, and the organic EL device could no longer maintain a display performance as a display device. It is necessary, therefore, that the organic EL device is configured to be kept out of contact with an external atmosphere. In a general manufacturing process, the array substrate is sealed by a sealing substrate, to which a desiccating material is added, in an inert gas atmosphere of, e.g. nitrogen gas, under dew-point management. In this case, the array substrate and the sealing substrate are bonded to each other via a sealing material mixed with granular spacers each having a size of several-ten μm. The spacer mixed in the sealing material defines a predetermined gap between the array substrate and the sealing substrate so as to prevent contact between the organic EL devices arranged on the array substrate and the desiccating material.

When the array substrate and the sealing substrate are to be bonded by the sealing material, the sealing material is cured by ultraviolet irradiation in the state in which both substrates are under pressure. In this case, there is a possibility that the granular spacers mixed in the sealing material may press a drive circuit provided in the vicinity of the sealing material. This may result in damage to the drive circuit. In particular, in display apparatuses used in small-sized mobile terminals, the production of which has increased in recent years, there is little extra area in the frame size and thus it is difficult to keep a sufficient margin. Consequently, the aforementioned problem tends to occur with the display apparatus for the small-sized mobile terminal, and the reliability may deteriorate.

In a case where a plurality of organic EL display apparatuses are to be cut out of a single mother substrate, there is no portions serving as fulcra along scribe lines. As a result, defects such as a chip tend to occur at end portions of the substrates of the cut-out organic EL display apparatuses, and it is difficult to cut out the display apparatuses with high precision.

BRIEF SUMMARY OF THE INVENTION

The present invention has been made to solve the above problems, and the object of the invention is to provide a display apparatus capable of enhancing reliability and process precision, and a method of manufacturing the display apparatus.

According to a first aspect of the present invention, there is provided a display apparatus comprising:

a first substrate including a display area having a plurality of pixels arranged in a matrix; and a second substrate disposed to be opposed to the first substrate, wherein the first substrate includes a separator that separates the pixels in the display area and is disposed to be spaced apart from the second substrate, and a support section disposed in a frame shape on an outer peripheral portion of the display area such that a predetermined gap is provided between the first substrate and the second substrate, the support section having a height substantially equal to a height of the separator.

According to a second aspect of the invention, there is provided a method of manufacturing a display apparatus including a first substrate having a plurality of display pixels arranged in a display area in a matrix and a separator separating the display pixels, a second substrate disposed to be opposed to the first substrate, and a seal material that seals the first substrate and the second substrate, the method comprising:

a step of forming a support section, which has a height substantially equal to a height of the separator, on a mother substrate having display areas corresponding to a plurality of the display apparatuses, the support section being provided on an outer peripheral portion of each of the display areas;

a step of sealing using the seal material, in a state in which the second substrate is disposed to be opposed to each display area of the mother substrate, spaced apart from the separator, and put in contact with the support section; and a step of cutting the mother substrate in accordance with the respective display areas, and cutting out the first substrate.

According to a third aspect of the invention, there is provided a method of manufacturing a display apparatus including a first substrate having a plurality of display pixels arranged in a display area in a matrix and a separator separating the display pixels, a second substrate disposed to be opposed to the first substrate, and a seal material that seals the first substrate and the second substrate, the method comprising:

a step of forming a support section, which has a height substantially equal to a height of the separator, on a first mother substrate having display areas corresponding to a plurality of the display apparatuses, the support section being provided on an outer peripheral portion of each of the display areas;

a step of sealing using the seal material, in a state in which a second mother substrate is disposed to be opposed to each display area of the first mother substrate, spaced apart from the separator, and put in contact with the support section; and a step of cutting the first mother substrate and the second mother substrate in accordance with the respective display areas, and cutting out the first substrate and the second substrate sealed by the seal material.

DETAILED DESCRIPTION OF THE INVENTION

A display apparatus according to an embodiment of the present invention and a method of manufacturing the display apparatus will now be described with reference to the accompanying drawings.

In this embodiment, a self-emission type display apparatus, such as an organic EL (electroluminescence) display apparatus, is described as the display apparatus by way of example.

Figure 1:
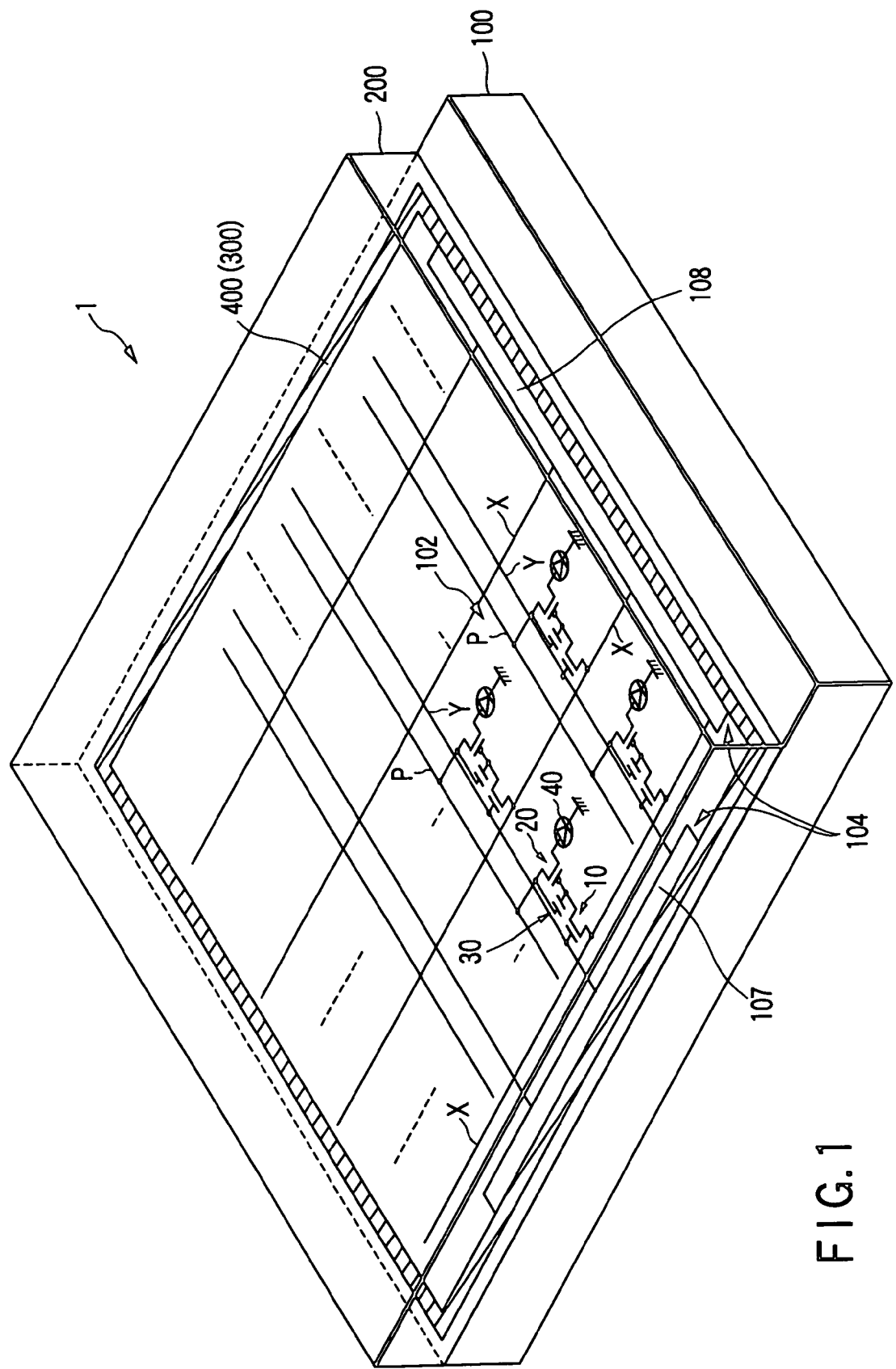
FIG. 1 schematically shows the structure of an organic EL display apparatus according to an embodiment of the present invention.
Figure 2:
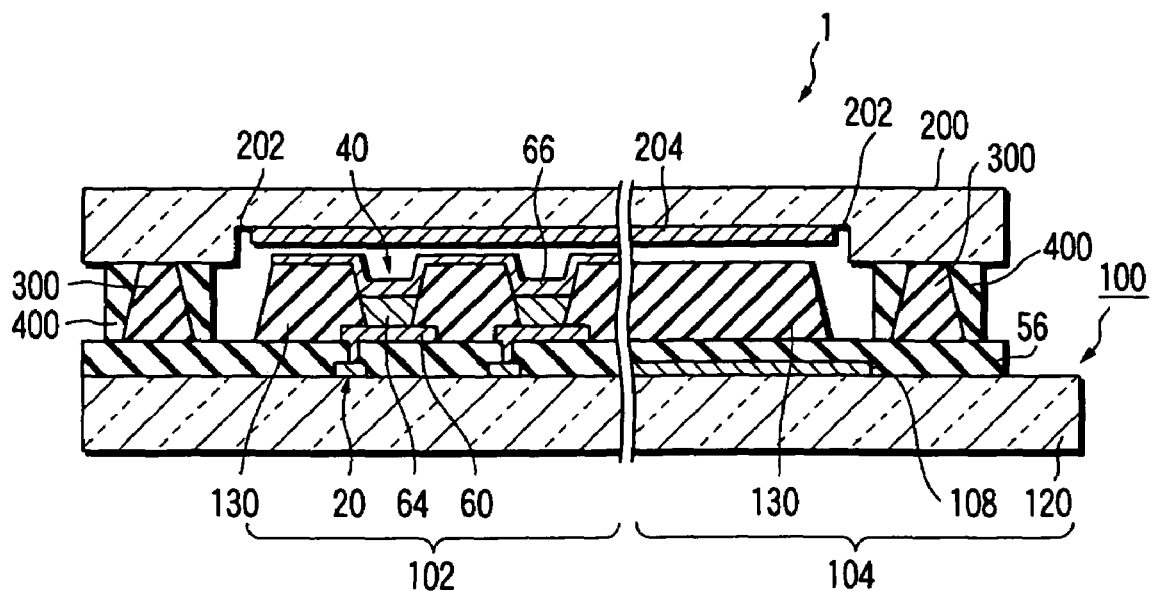
FIG. 2 is a cross-sectional view schematically showing the structure of the organic EL display apparatus shown in FIG. 1.

As is shown in FIG. 1 and FIG. 2, an organic EL display apparatus 1 comprises an array substrate 100 as a first substrate, on which organic EL devices serving as display devices are arranged in a matrix, and a sealing substrate 200 as a second substrate, which is disposed to be opposed to the array substrate 100. A display area 102 of the array substrate 100, which displays an image, comprises three kinds of light-emitting portions, that is, pixels, which emit red, green and blue lights, respectively. Each pixel is separated by separators 130. Each pixel includes an organic EL device 40 serving as a self-emission type display device. The sealing substrate 200 seals the display area 102 of the array substrate 100.

The organic EL device 40 comprises a first electrode 60, a second electrode 66 and an organic light-emitting layer 64 functioning as a light-emitting layer. The first electrode 60 is formed in an independent insular shape for each pixel, and is electrically insulated. The second electrode 66 is disposed to be opposed to the first electrode 60 and is commonly formed for a plurality of pixels. The organic light-emitting layer 64 is sandwiched between the first electrode 60 and the second electrode 66.

In each pixel of the display area 102, the array substrate 100 includes a pixel switch 10 composed of, e.g. an N-type thin-film transistor, a drive control device 20 composed of, e.g. a P-type thin-film transistor, a capacitor element 30, and the organic EL device 40. The organic EL device 40 is selected via the pixel switch 10. An excitation power for the organic EL device 40 is controlled by the drive control device 20.

The array substrate 100 includes a plurality of scan lines Y arranged in the row direction of the organic EL devices 40, a plurality of signal lines X arranged in the column direction of the organic EL devices 40, and power supply lines P for supplying power to a first electrode of each organic EL device 40. In a peripheral area 104 surrounding the display area 102, the array substrate 100 further includes a scan line drive circuit 107 for supplying drive signals to the scan lines Y and a signal line drive circuit 108 for supplying drive signals to the signal lines X.

The scan lines Y are connected to the scan line drive circuit 107. The signal lines Y are connected to the signal line drive circuit 108. The pixel switch 10 is provided near an intersection between the scan line Y and signal line X. The drive control device 20 is connected in series with the organic EL device 40. The capacitance element 30 is connected in series with the pixel switch 10 and in parallel with the drive control device 20. Both electrodes of the capacitance element 30 are connected to the gate electrode and source electrode of the drive control device 20, respectively.

The power supply line P is connected to a first electrode power supply line (not shown) arranged on the peripheral area 104. A second electrode of the organic EL device 40 is connected to a second electrode power supply line (not shown) which is arranged on the peripheral area 104 and supplies a common potential.

More specifically, the pixel switch 10 in this embodiment is composed of an N-type thin-film transistor. In the pixel switch 10, the gate electrode is connected to the scan line Y, the source electrode is connected to the signal line X, and the drain electrode is connected to one electrode of the capacitance element 30 and to the gate electrode of the drive control device 20. In the drive control device 20, the source electrode is connected to the power supply line P, and the drain electrode is connected to the first electrode 60 of the organic EL device 40. The other electrode of the capacitance element 30 is connected to the power supply line P.

When the pixel switch 10 is selected via the associated scan line Y, the pixel switch 10 writes a drive signal of the associated signal line X in the capacitance element 30, and controls the operation of the drive control device 20. The gate voltage of the drive control device 20 is adjusted on the basis of the drive signal. The drive control device 20 supplies a desired drive current from the power supply line P to the organic EL device 40.

Figure 3:
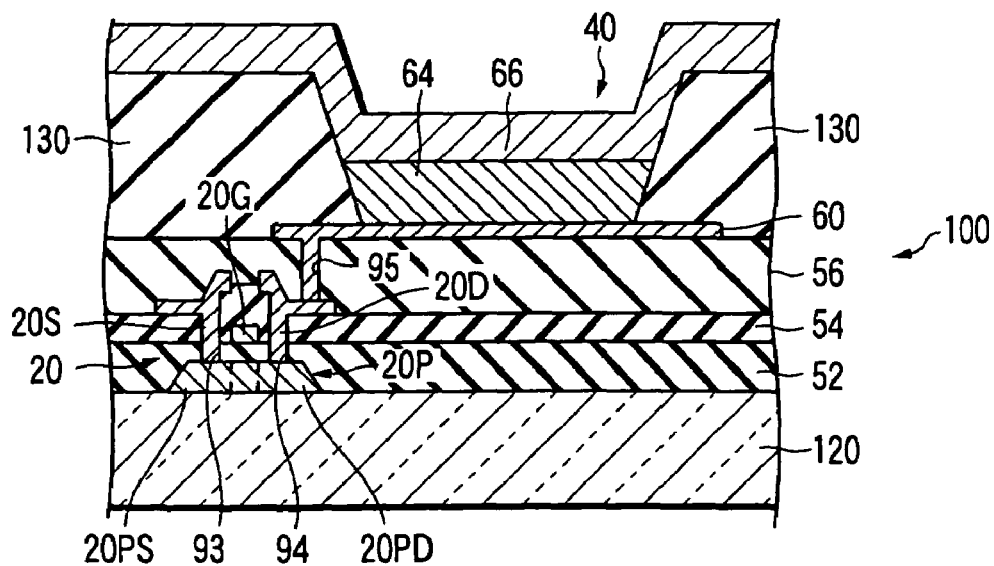
FIG. 3 is a cross-sectional view schematically showing the structures of an organic EL device and a drive control device in the organic EL display apparatus shown in FIG. 1.

FIG. 3 is a schematic cross-sectional view showing the drive control device 20 and organic EL device 40 of the array substrate 100.

The drive control device 20 includes a polysilicon semiconductor layer 20P disposed on an insulating support substrate 120 formed of, e.g. glass. In the drive control device 20, a gate electrode 20G is provided on the polysilicon semiconductor layer 20P via a gate insulation film 52. A source electrode 20S is put in contact with a source region 20PS of the polysilicon semiconductor layer 20P via a contact hole 93 that penetrates the gate insulation film 52 and an interlayer insulation film 54. A drain electrode 20D is put in contact with a drain region 20PD of the polysilicon semiconductor layer 20P via a contact hole 94 that penetrates the gate insulation film 52 and interlayer insulation film 54.

The organic EL device 40 is disposed on an insulation film 56 provided on the interlayer insulation film 54. The organic EL device 40 for one pixel is partitioned by the separators 130 arranged within the display area in a matrix. The separator 130 comprises, for example, a hydrophilic film such as a silicon oxide film (SiO) and a hydrophobic film such as a resin resist. In each pixel, the first electrode 60 is electrically insulated from adjacent pixels by the separators 130. The separators 130 are so arranged as to overlap peripheral portions of the first electrode 60. Thus, the electrode portion, which is exposed from the hydrophilic film of the separator 130, functions substantially as the first electrode.

In the organic EL device 40, the lower-side first electrode 60 functions as an anode, and the first electrode 60 is provided on the insulation film 56. The first electrode 60 is connected to the drain electrode 20D of the drive control device 20 via a contact hole 95 that penetrates the insulation film 56. The first electrode 60 is formed of a light-transmissive electrically-conductive material such as ITO (Indium Tin Oxide) or IZO (Indium Zinc Oxide).

The organic light-emitting layer 64 sandwiched between the first electrode 60 and second electrode 66 may have a three-layer stacked structure comprising a hole transporting layer and an electron transporting layer, which are commonly formed for respective colors, and a light-emitting layer formed individually for each color. Alternatively, the organic light-emitting layer 64 may have a two-layer structure or a single layer structure having an integrated function of the three layers. For example, the hole transporting layer is interposed between the anode and the light-emitting layer and is formed of a thin film of an aromatic amine derivative, a polythiophene derivative, polyaniline derivative, etc. The light-emitting layer is interposed between the hole transporting layer and the cathode and is formed of an organic compound that emits red, green or blue light. When the light-emitting layer is formed by using, for instance, a high-polymer material, it has a stacked structure of PPV (poly-para-phenylenevinylene), a polyfluorene derivative or a precursor thereof, etc.

In the organic EL device 40, the upper-side second electrode 66 functions as a cathode. The second electrode 66 is commonly provided on the organic light-emitting layers 64 of the respective organic EL devices 40. The second electrode 66 is formed of a light-shield metal film of, e.g. Ca (calcium), Al (aluminum), Ba (barium), Ag (silver), etc.

The sealing substrate 200 includes a recess portion 202 that extends over at least a region corresponding to the display area 102. The sealing substrate 200 having this structure has a desiccating agent 204 disposed in the recess portion 202. The desiccating agent 204 absorbs moisture evaporated from the organic EL device 40, etc.

The array substrate 100 further includes a support section 300 arranged in a frame shape surrounding the outer periphery of the display area 102. The support section 300 has such a height as to provide a predetermined gap between the array substrate 100 and sealing substrate 200 in the display area 102. The height of the support section 300 is substantially equal to the height of the separator 130. When the support section 300 supports the sealing substrate 200 in the peripheral area 104, the separator 130 on the array substrate 100 is spaced apart from the sealing substrate 200 in the display area 102. Specifically, the sealing substrate 200 has the recess portion 202 opposed to the display area 102. Thus, even if the height of the separator 130 is substantially equal to that of the support section 300, the separator 130 does not contact the desiccating agent 204 provided on the sealing substrate 200.

As is shown in FIG. 1, for example, the support section 300 has a continuous loop shape surrounding the display area 102. Thereby, when the sealing substrate 200 is supported by the support section 300 on the array substrate 100 in the peripheral area 104, the display area 102 is sealed.

The support section 300 is formed of, e.g. resin resist. The support section 300 and the separators 130 arranged on the display area 102 may be formed of the same material. In this case, the support section 300 and the separators 130 may be formed in the same fabrication step. In particular, the water-repellent film of the separator 130 and the support section 300 may be formed of the same material in the same fabrication step. This fabrication method does not require an increase in number of fabrication steps for forming the support section 300, and can prevent a decrease in yield.

Since the display area 102 of the array substrate 100 is sealed by the support section 300 and sealing substrate 200, external moisture is prevented from entering the sealed space. This prevents degradation of the organic EL device 40. In particular, when the separator 130 and support section 300 are formed by the same fabrication steps, entrance of moisture can more effectively be prevented.

The array substrate 100 and sealing substrate 200 are sealed by a seal material 400. The seal material 400 is formed of a photosensitive resin, e.g. an ultraviolet curing resin. Additionally, the seal material may be formed of a photosensitive resin mixed with a desiccating agent. If this seal material 400 is used, entrance of external moisture can be prevented by arranging the seal material 400 on both sides of the support section 300. Moreover, moisture within the sealed space can effectively be eliminated. In the case where the desiccating agent is mixed in the seal material 400, it is not necessary to dispose the desiccating agent 204 in the recess portion 202 of the sealing substrate 200.

The gap between the array substrate 100 and the sealing substrate 200 is kept constant by the support section 300. Moreover, since the support section 300 is arranged on the outer peripheral part of the display area 102, the mechanical strength of the entire display apparatus is increased.

An insert gas such as nitrogen gas is filled in the sealed space defined by the support section 300 in the predetermined gap between the array substrate 100 and sealing substrate 200. The humidity in the sealed space is maintained at such a low level as not to adversely affect the organic EL device 40.

In the organic EL device 40 with the above-described structure, electrons and holes are injected in the organic light-emitting layer 64 sandwiched between the first electrode 62 and second electrode 66. The electron and hole are recombined to form an exciton, and light is produced by photo-emission of a predetermined wavelength which occurs when the exciton is deactivated. The EL light is emitted from the lower surface side of the array substrate 100, that is, from the first electrode 60 side.

A method of manufacturing the organic EL device having the above-described structure will now be described. In the method to be described here, array substrates corresponding to a plurality of EL display apparatuses are cut out of a single mother substrate.

Figure 4:
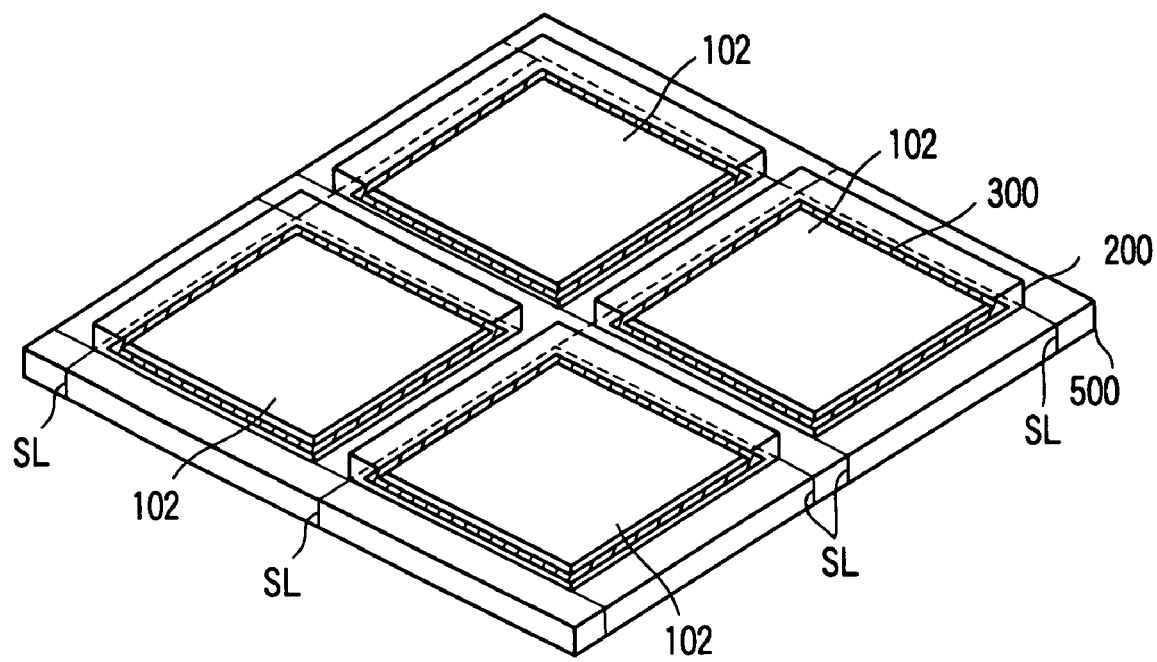
FIG. 4 is a perspective view for describing a method of manufacturing the organic EL display apparatus.
Figure 5:
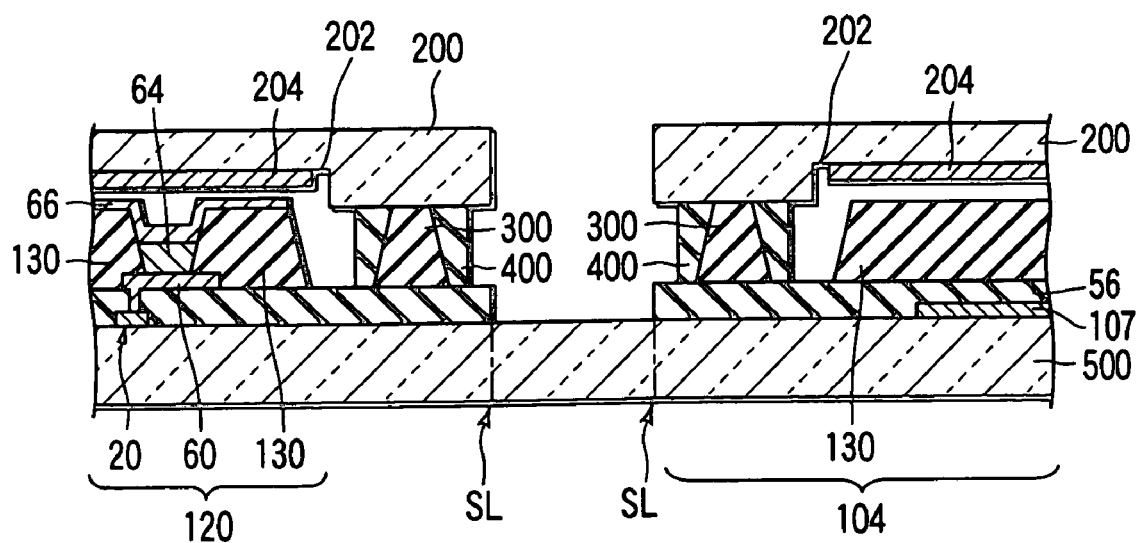
FIG. 5 is a cross-sectional view for describing the method of manufacturing the organic EL display apparatus.

As is shown in FIGS. 4 and 5, display areas corresponding to a plurality of organic EL display apparatuses are formed on a mother substrate 500 for array substrates. Specifically, processes of forming a semiconductor layer, a metal layer and an insulation layer on the mother substrate 500 and patterning these layers are repeated. Thereby, for each display area 102, the processes are carried out to form polysilicon semiconductor layers of TFTs that make up pixel switches 10, drive control devices 20, drive circuits 107 and 108, etc., as well as gate electrodes, capacitance elements 30, gate insulation films 52, interlayer insulation films 54, etc.

Subsequently, source electrodes and drain electrodes of the TFTs are formed. In this case, the source electrode of the pixel switch 10 is formed integral with the signal line X. Thereafter, the insulation film 56 is formed on the TFTs, and then first electrodes 60 are formed in independent insular shapes at positions corresponding to the respective display devices 40 on the insulation film 56. In this case, the drain electrode 20D of the drive control device 20 is electrically connected to the first electrode 60.

Next, separators 130 for electrically insulating each display device 40 are formed on the display area 102. To begin with, a film of a hydrophilic material is formed. A part of this film is selectively removed, thereby forming a hydrophilic film having an opening for partly exposing the first electrode 60. Then, a film of a hydrophobic material is formed, and a part thereof is selectively removed, thereby forming a hydrophobic film having an opening for partly exposing the opening of the hydrophilic film. The plural organic EL devices 40 surrounded by the separators 130 emit light of the same color, for example, in units of a column. In the step of forming the hydrophobic film, a frame-shaped support section 300 having approximately the same height as the separators 130 is formed at the same time on the outer periphery of the display area 102.

Following the above steps, a light-emission material is applied by, e.g. an ink jet method, onto the first electrode 60 exposed from the opening of the separator 130. Thus, the organic light-emitting layer 64 is formed. Subsequently, the second electrode 66 is formed on the organic light-emitting layer 64. Thereby, the organic EL device 40 is formed.

On the other hand, the desiccating agent 204 is disposed in the recess portion 202 of the sealing substrate 200. Then, seal materials 400 are applied onto the mother substrate 500. For example, the seal material 400 is applied onto the support section 300 in a frame shape. In an atmosphere subjected to dew-point management, a plurality of sealing substrates 200 are disposed and sealed to be opposed to each display area 102 on the mother substrate 500. Thereby, the organic EL devices 40 are sealed in the sealed spaces between the mother substrate 500 and the sealing substrates 200. In this case, the support sections 300 on the mother substrate 500 support the sealing substrates 500. Thus, the seal materials 400 applied to the support sections 300 are present on both sides of the support sections 300 and bond the mother substrate 500 and sealing substrates 200.

Thereafter, the mother substrate 500 is cut into unit sizes corresponding to the respective organic EL display apparatuses. Specifically, predetermined cutting-lines are scribed on the surface of the mother substrate 500 by a scriber formed of a sharp, hard member of, e.g. diamond. Cracks are made along the cutting-lines. After cracks, i.e. scribe lines SL, are formed along the cutting-lines, an impact is uniformly applied along the scribe lines SL, using a rubber rod-like member called a break bar. Thereby, the cracks are progressed within the substrate along the scribe lines SL, and the mother substrate 500 is cut.

When a plurality of organic EL display apparatuses are cut out of the single mother substrate, as described above, it is desirable to situate the support sections 300 near the scribe lines SL. Thereby, in the step of cutting the mother substrate 500, the support sections 300 function as fulcra and occurrence of defects in scribing can be prevented. Moreover, high-precision cutting is enabled with respect to display apparatuses for small-sized mobile terminals, which have little margin in the frame size. Addition-ally, it is desirable that the support sections 300 be disposed substantially in parallel with the scribe lines SL. With such disposition, higher-precision cutting of the mother substrate is enabled. It is preferable that, as shown in FIG. 5, the support sections 300 be situated on both sides of the scribe lines SL in the vicinity of the central portion of the mother substrate 500 where a plurality of organic EL display apparatuses are located adjacent to one another. With such arrangement, higher-precision cutting of the mother substrate can be achieved.

The support section 300 with a predetermined width is disposed in a frame shape along the outer periphery of the sealing substrate 200. The array substrate 100 and sealing substrate 200 are sealed via the support section 300. Therefore, the strength of the display apparatus as a whole can be increased.

Another method of manufacturing the organic EL device having the above-described structure will now be described. In the method of this example, two mother substrates are used to form a plurality of organic EL display apparatus cells. Thereafter, array substrates and sealing substrates corresponding to a plurality of organic EL display apparatuses are cut out of the mother substrates.

Figure 6:
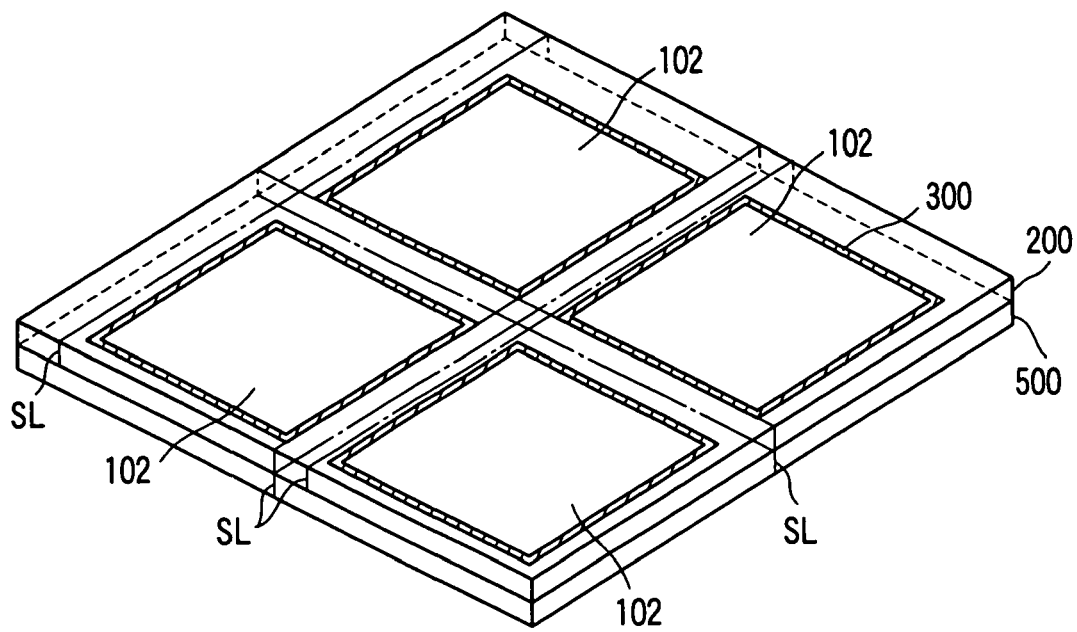
FIG. 6 is a perspective view for describing another method of manufacturing the organic EL display apparatus.
Figure 7:
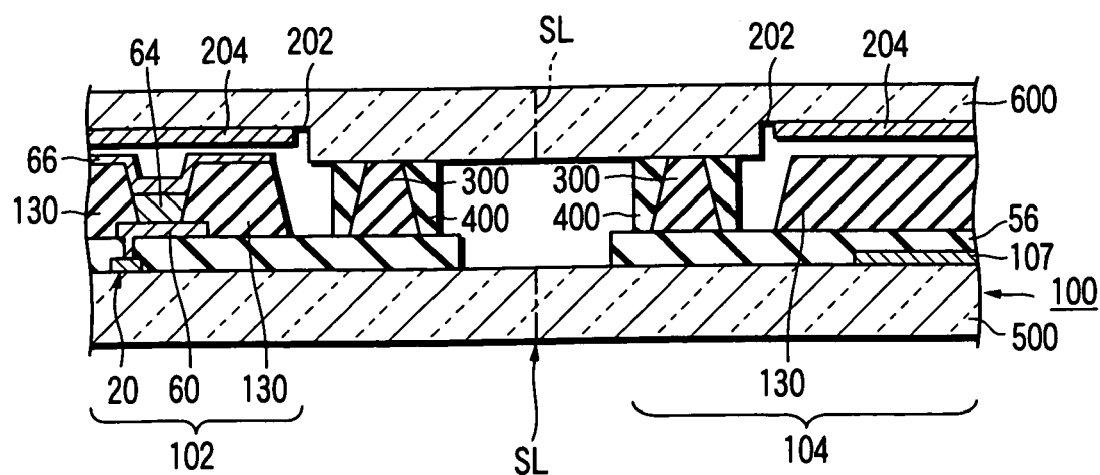
FIG. 7 is a cross-sectional view for describing this another method of manufacturing the organic EL display apparatus.

As is shown in FIGS. 6 and 7, a plurality of display areas 102 and drive circuits 107, 108 are formed on a mother substrate for array substrates (first mother substrate) 500. Then, a support section 300 is formed on an outer periphery portion of each display area 102. A desiccating agent 204 is disposed in each recess portion 202 of a mother substrate for sealing substrates (second mother substrate) 600. Subsequently, seal material 400 is applied to each sealing substrate 200 in a frame shape. In an atmosphere subjected to dew-point management, the mother substrate 600 is sealed on the mother substrate 500. Thereafter, the mother substrate 500 and mother substrate 600 are cut into unit sizes corresponding to the respective display areas 102. Thereby, organic EL display apparatuses each having the array substrate 100 and sealing substrate 200 which are sealed by the seal material 400 are cut out.

With this manufacturing method, too, the same advantages as with the previously described manufacturing method can be obtained.

The present invention is not limited to the above-described embodiments, and various modifications can be made without departing from the spirit of the invention.

For example, in display apparatuses for small-sized mobile terminals, which have little margin in the frame size, the support section 300 for providing the gap may be disposed over each drive circuit arranged on the outer peripheral portion of the display area 102. Specifically, in FIG. 8, a support section 300 is disposed over a drive circuit 700 such as a scan line drive circuit or a signal line drive circuit. In this case, a pressure is applied to the drive circuit 700 via the support section 300 when the array substrate 100 and sealing substrate 200 are sealed by the seal material 400 or when scribing is performed on the mother substrate 500 (600).

In the prior art wherein the mechanical strength for providing the gap is secured by mixing fibers in the seal material 400 without disposing the support section 300, if the aforementioned pressure is applied, the fibers may pierce the drive circuit 700, causing damage to the drive circuit 700.

Figure 8:
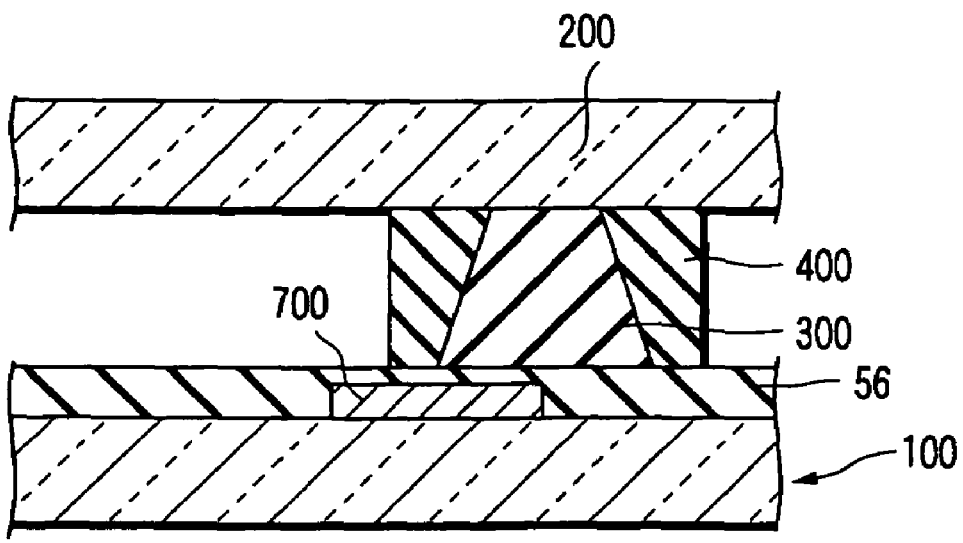
FIG. 8 shows an example of the positional relationship between a support section and a drive circuit.

By contrast, in the structure shown in FIG. 8 wherein the support section 300 is disposed on the outer peripheral portion of the display area 102, the applied pressure can be dispersed over the entire support section 300 and damage to the drive circuit 700 can be prevented. Therefore, even in the case of display apparatuses with little margin in the frame size, high reliability is attained.

Figure 9:
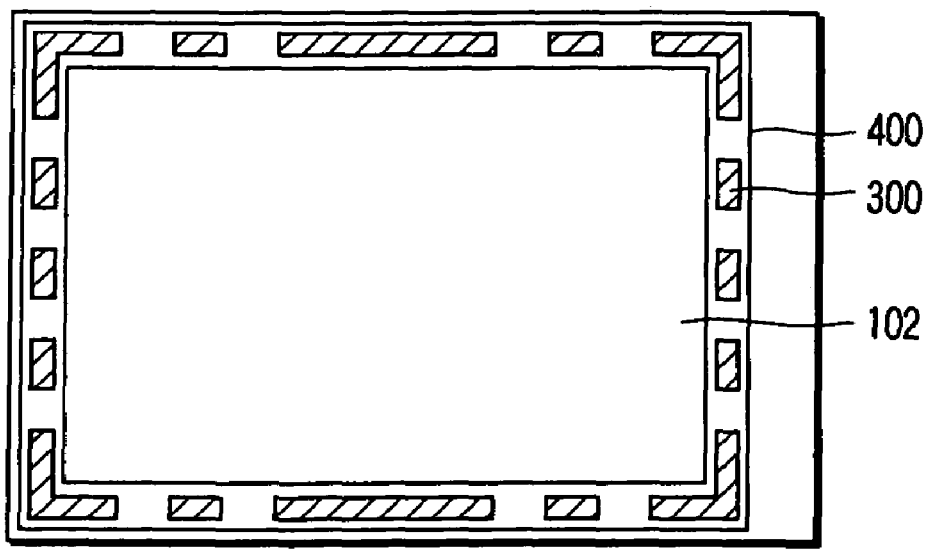
FIG. 9 schematically shows the structure of an array substrate in a case where insular support portions are arranged.

In the above-described embodiment, the support section 300 has a continuous loop shape surrounding the display area 102. Alternatively, insular support sections may be provided. That is, as shown in FIG. 9, insular support sections 300 may be disposed along the outer periphery of the display area 102 and the seal material 400 may be provided along the support section 300.

The support section 300 may be formed of a resin material including a desiccating agent. This effectively prevents external moisture from entering the sealed space between the array substrate 100 and sealing substrate 200. In this case, the seal material 400 may not necessarily include the desiccating agent. In addition, there is no need to dispose the desiccating agent 400 in the recess portion 202 of the sealing substrate 200.

The above-described embodiment adopts a so-called bottom-surface emission system in which EL light is emitted from the first electrode side situated on the lower side of the array substrate. The present invention, however, is also applicable to a so-called top-surface emission system in which EL light is emitted from the second electrode side situated on the upper side.

As has been described above, the display apparatus of this invention and the method of manufacturing the same can enhance the reliability and process precision. In addition, the mechanical strength of the entire display apparatus can be increased. Furthermore, entrance of external moisture, etc. via the seal material can surely be prevented, and degradation in the display apparatus can effectively be suppressed. Besides, the gap between the array substrate and the sealing substrate can uniformly be maintained.

As has been described above, the present invention can provide a display apparatus and a method of manufacturing the same, which can enhance the reliability and processing precision.

What is claimed is:

1. A display apparatus comprising:
   a first substrate including a display area having a plurality of pixels arranged in a matrix; and
   a second substrate disposed to be opposed to the first substrate, the second substrate including a recess portion that extends over a region corresponding to the display area,
   wherein the first substrate includes,
   a separator that separates the pixels in the display area and is disposed to be spaced apart from the second substrate, and
   a support section disposed in a frame shape on an outer peripheral portion of the display area such that a predetermined gap is provided between the first substrate and the second substrate, the support section having a height substantially equal to a height of the separator.

2. The display apparatus according to claim 1, wherein the support section and the separator are formed of the same material.

3. The display apparatus according to claim 1, wherein the support section is formed in a loop shape such that the support section seals between the display area of the first substrate and the second substrate.

4. The display apparatus according to claim 1, wherein the support section is disposed over a drive circuit for driving the pixels.

5. The display apparatus according to claim 1, wherein the second substrate provides a desiccating agent.

6. The display apparatus according to claim 1, wherein the support section is formed of a resin including a desiccating agent.

7. The display apparatus according to claim 1, wherein the pixel includes a self-emission type display device.

8. The display apparatus according to claim 7, wherein the self-emission type display device comprises a first electrode formed in an independent insular shape for each pixel, a second electrode disposed to be opposed to the first electrode and commonly formed for all the pixels, and a light-emitting layer sandwiched between the first electrode and the second electrode.

9. The display apparatus according to claim 1, wherein a seal material for sealing between the first substrate and the second substrate is disposed on both sides of the support section.

10. The display apparatus according to claim 9, wherein the seal material is formed of a resin including a desiccating agent.

11. The display apparatus according to claim 1, wherein the support section is formed in an insular shape on an outer peripheral portion of the display area.

* * * * *